United States Patent
Smith et al.

(10) Patent No.: US 11,414,783 B2
(45) Date of Patent: Aug. 16, 2022

(54) LASER WRITING FOR COLOUR CENTRES IN CRYSTALS

(71) Applicant: Oxford University Innovation Limited, Oxford (GB)

(72) Inventors: Jason Smith, Oxford (GB); Martin Booth, Oxford (GB); Patrick Salter, Oxford (GB); Yu Chen Chen, Oxford (GB)

(73) Assignee: Oxford University Innovation Limited, Oxford (GB)

(*) Notice: Subject to any disclaimer, the term of this patent is extended or adjusted under 35 U.S.C. 154(b) by 22 days.

(21) Appl. No.: 17/057,226

(22) PCT Filed: May 17, 2019

(86) PCT No.: PCT/GB2019/051358
§ 371 (c)(1),
(2) Date: Nov. 20, 2020

(87) PCT Pub. No.: WO2019/224524
PCT Pub. Date: Nov. 28, 2019

(65) Prior Publication Data
US 2021/0207287 A1    Jul. 8, 2021

(30) Foreign Application Priority Data
May 22, 2018  (GB) ................................... 1808367

(51) Int. Cl.
*C30B 33/00* (2006.01)
*G01N 21/64* (2006.01)
*C30B 29/04* (2006.01)

(52) U.S. Cl.
CPC ......... *C30B 33/00* (2013.01); *G01N 21/6402* (2013.01); *C30B 29/04* (2013.01)

(58) Field of Classification Search
CPC ..... C30B 33/00; C30B 29/04; C04B 41/5002; G01N 21/6402; C01B 32/25
See application file for complete search history.

(56) References Cited

U.S. PATENT DOCUMENTS 4,880,613 A * 11/1989 Satoh ...................... C30B 33/00
                                                              264/1.36
4,964,133 A    10/1990 Pollock et al.
(Continued)

FOREIGN PATENT DOCUMENTS

EP    0275063 A2    7/1988
EP    2221810 A2    8/2010
(Continued)

OTHER PUBLICATIONS

International Search Report and Written Opinion of the International Searching Authority, PCT Application No. PCT/GB2019/051358, dated Jul. 15, 2019, 16 pages.
(Continued)

*Primary Examiner* — Robert M Kunemund
(74) *Attorney, Agent, or Firm* — McDonnell Boehnen Hulbert & Berghoff LLP

(57) ABSTRACT

A method of fabricating one or more colour centres in a crystal is described. The method comprises focusing a laser into a crystal to induce the creation, modification, or diffusion of defects within a focal region of the laser. Fluorescence detection is used to determine when one or more colour centres are formed within the focal region and the laser is terminated when a desired number of colour centres have been formed. The method enables colour centres to be formed in a crystal with a high degree of control in terms of both the number and location of colour centres within the crystal, and a degree of control over other parameters such as colour centre orientation and local environment. In par-
(Continued)

ticular, it is possible to form a well-defined pattern of colour centres within a crystal.

19 Claims, 7 Drawing Sheets

(56) References Cited

U.S. PATENT DOCUMENTS

2011/0315988 A1 12/2011 Yu et al.
2019/0145919 A1* 5/2019 Clevenson ........... G01R 33/323
   324/304

FOREIGN PATENT DOCUMENTS

RU      2465377 C1    10/2012
WO   2017006092 A1    1/2017

OTHER PUBLICATIONS

Chen, Y., Salter, P., Knauer, S. et al. Laser writing of coherent colour centres in diamond. Nature Photon 11, 77-80 (2017). https://doi.org/10.1038/nphoton.2016.234.
UKIPO Combined Search and Examination Report under Sections 17 and 18(3), GB Application 1808367.5, dated Dec. 4, 2018, 8 pages.

* cited by examiner

LASER WRITING FOR COLOUR CENTRES IN CRYSTALS

CROSS REFERENCE TO RELATED APPLICATIONS

The present application is a national stage entry of, and claims priority to, PCT/GB2019/051358, filed on May 17, 2019, which claims priority to UK Application GB 1808367.5, filed in the UK Patent Office on May 22, 2018, both of which are hereby incorporated in their entirety herein by reference.

FIELD OF INVENTION

The present specification relates to crystals comprising colour centres and to methods of fabricating crystals comprising colour centres by laser writing the colour centres into crystals. An apparatus is also described for fabricating colour centres in crystals.

BACKGROUND OF INVENTION

Colour centres are point defects in a crystal lattice which absorb and emit light at particular wavelengths characteristic of the nature of the defects. Colour centres form in a range of crystal types and have a range of structures which include single impurity atoms, lattice vacancies, and combinations thereof. For example, vacancy defects may combine into pairs or clusters or combine with impurity atoms to form unique vacancy structures with their own individual properties. Examples include silicon-containing defects such as silicon-vacancy defects (Si-V), silicon di-vacancy defects (Si-V2), silicon-vacancy-hydrogen defects (Si-V:H), silicon di-vacancy hydrogen defects (S-V2:H) and nitrogen containing defects such as nitrogen-vacancy defects (N-V), di-nitrogen vacancy defects (N-V-N), and nitrogen-vacancy-hydrogen defects (N-V-H). These defects are typically found in a neutral charge state or in a charged state, e.g. negatively charged.

Colour centres occur naturally in many crystal types, being formed during crystal growth. Alternatively, crystals can be processed or treated to introduce colour centres into the crystal lattice. For example, irradiation, implantation, and thermal annealing techniques can be used, either alone or in combination, to produce desirable colour centres within a crystal lattice. Such colour centres can be useful for a number of optical, electronic, and quantum sensing and information processing applications.

The engineering of materials at the scale of individual atoms has long been viewed as a holy grail of technology. With the extreme miniaturization of modern semiconductor technology to sub-10 nm feature sizes and the emerging promise of quantum technologies that rely inherently on the principles of quantum physics, the ability to fabricate and manipulate atomic-scale systems is becoming increasingly important.

One promising approach to quantum information technologies is the use of colour centre point defects in wide band gap materials that display strong optical transitions, allowing the addressing of single atoms using optical wavelengths within the transparency window of the solid. Fluorescence from single colour centres displays quantum statistics with potential for use in communications, sensing and metrology, while some colour centres also possess spin degrees of freedom that can be accessed via the optical transitions, opening the door for use as highly sensitive magnetic field sensors or as quantum memories for use in optical networks for communications or computing technologies.

The fabrication and engineering of colour centres is challenging, since they comprise impurity atoms and/or lattice vacancies which are bound together in a stable configuration. The process of fabrication involves the introduction of the required component defects into the lattice followed by thermal annealing to stimulate diffusion of one or more component defects through the lattice whereupon random binding occurs to create the colour centres.

An extensively researched colour centre is the negatively charged nitrogen-vacancy (NV) centre in diamond. NV centres have provided advances in photon-mediated entanglement and quantum teleportation over long distances, nanoscale nuclear magnetic resonance imaging, and are one of the few physical systems to have been shown to support quantum logic gates with fidelity above the threshold for fault-tolerant quantum computing. NV centres are formed by the binding of a substitutional nitrogen with a lattice vacancy along a [111] crystal axis. The controlled positioning of NV centres requires the targeted implantation of nitrogen ions, typically achieved using ion implantation, the formation of vacancies in the crystal, typically achieved using electron beam irradiation, and combining of the nitrogen and vacancy defects via thermal annealing, typically at a temperature in a range 800° C. to 1000° C. to cause diffusion of the vacancies through the crystal lattice pairing randomly with substitutional nitrogen defects. Recently, laser processing was shown to be an effective way of writing lattice vacancies into diamond with minimal residual damage such that binding with substitutional nitrogen impurities already present in the lattice yielded high quality NV centres. The 'global' thermal anneal used to facilitate NV binding meant that the process was inherently stochastic, such that the maximum possible yield for creating a single NV centre at a chosen site was 37% as determined by Poisson statistics, and meant that the positioning accuracy of the NV generation was limited to a few hundred nanometres by the vacancy diffusion length. The low yield and modest positioning accuracy may potentially limit the usefulness of such a technique in device manufacturing.

It is an aim of the present invention to provide an improved technique for fabricating colour centres in a crystal lattice and particular to improve control over the number, position, and yield of colour centres which are formed within the crystal lattice.

SUMMARY OF INVENTION

The present specification describes a method for the deterministic writing of individual colour centres into crystals at selected locations with high positional accuracy using laser processing with online fluorescence feedback. The method provides a tool for the fabrication of engineered materials and devices for quantum technologies.

According to one aspect of the invention as described herein a method of fabricating one or more colour centres in a crystal is provided, the method comprising:
  focusing a laser into a crystal to induce the creation, modification, or diffusion of defects within a focal region of the laser;
  detecting, via fluorescence, when a colour centre is formed within the focal region; and
  terminating the laser when a desired number of colour centres have been formed.

Creating colour centres using solely laser-induced processes has been found to provide an improved positional accuracy of colour centres when compared with methods which utilize bulk thermal annealing of the crystal to fabricate the colour centres. While not being bound by theory, it is believed that the laser facilitates physical processes such as the diffusion of vacancies only in a small volume near the highest intensity of the laser focus such that colour centres are formed only in this region.

Colour centres may be formed by several physical mechanisms including the diffusion of a vacancy to bind to another existing defect, the laser-induced modification of an existing defect such as by the dissociation of a vacancy, or the generation of a Frenkel defect immediately adjacent to a substitutional impurity. Equally a colour centre may be destroyed by the action of the laser, for example by the dissociation of a vacancy from the remainder of the defect, or by the capture of another vacancy or interstitial defect in the lattice.

Further still, by detecting, via fluorescence, when a colour centre is formed within the focal region the laser can be terminated such that a controlled number of colour centres can be formed. For example, fluorescence can be monitored at least within a wavelength range of 650 nm to 750 nm which is suitable for detecting NV⁻ colour centres in diamond.

One advantage of the present invention is the ability to control precisely the number and position of colour centres which are formed in the crystal lattice. This is not possible using a bulk thermal annealing method as the formation of colour centres is stochastic and thus colour centres will form at different rates in different parts of the crystal. If a thermal anneal is applied until at least one colour centre is formed at each and every location of a desired pattern within a crystal then many of the locations will have multiple colour centres by the time that a colour centre is formed at the last location in the pattern. That is, a pattern of colour centres will be produced but with a varying number of colour centres at each location of the pattern. The present invention thus not only provides an increased accuracy in terms of positioning of colour centres but also enables control of the number of colour centres at each location such that, for example, every point of the pattern has the same number of colour centres.

Physical processes such as vacancy generation, vacancy diffusion, diffusion of interstitial defects, or dissociation of defect complexes correspond to the 'hopping' of one or more atoms in the crystal between positions in the lattice, those positons corresponding to local minima in the potential energy of the system with some potential energy barrier between them. Different hopping processes have different potential energy barrier heights and so require different energies to be supplied to allow the processes to occur. The activation of these processes by the laser is therefore sensitive to such parameters as laser wavelength, pulse energy and pulse duration. It may therefore be advantageous to apply the laser treatment in two or more stages using different laser wavelengths, pulse energies or pulse durations to achieve different steps in the creation and modification of colour centres. For example, the method may comprise:

focusing a first laser beam into the crystal to induce the generation of vacancy defects in the focal region of the first laser beam within the crystal, the first laser beam having a first energy; and focusing a second laser beam onto the focal region to induce diffusion of the vacancy defects within the focal region, the second laser beam having a second energy which is lower than the first energy but which is sufficient to induce diffusion of vacancy defects within the focal region.

In such a method, the first laser beam can provide a laser pulse of energy sufficient to generate vacancies within the crystal. Furthermore, the second laser beam can provide a stream of laser pulses of energy sufficiently high to induce vacancy diffusion but sufficiently low as to not form new vacancy defects. The second laser beam can provide sub-picosecond laser pulses which have been found to be suitable to cause vacancy migration in a diamond crystal for example. Furthermore, the nonlinear response of the material in respect of vacancy generation and vacancy diffusion relative to the laser pulse energy is such that, a narrow window of pulse energies exists in which colour centres are generated but continued processing does not ultimately lead to runaway lattice damage indicative of further vacancy generation.

The laser can be terminated when a single colour centre has been formed in the focal region or alternatively when a desired number of colour centres have been formed in the focal region. The termination step is controlled according to the fluorescence signal detected by a photodetector. Furthermore, the method can be repeated at a plurality of points within the crystal to generate a pattern of colour centres within the crystal. As previously stated, the present method enables a pattern of colour centres to be generated while controlling both the position and number of colour centres at each point of the pattern.

The laser (including the aforementioned first and/or second laser beam) may be configured to provide a beam with a cross-sectional beam profile having a full-width-half maximum of no more than 500 nm, 400 nm, 350 nm, 200 nm, 250 nm, or 100 nm. Using a narrow beam enables more accurate positioning of the colour centres.

Furthermore, after detecting, via fluorescence, when a colour centre or combination of colour centres is formed within the focal region, laser processing can be continued until a colour centre is formed with a desired crystallographic orientation. In principle processing can also be continued until a colour centre is formed with other desired parameters such as charge state or local environment. To this extent, the present methodology may be used to control orientation, and in principle other parameters, in addition to controlling the number and location of colour centres which are formed.

According to another aspect of the present invention, there is provided an apparatus for fabricating colour centres in a crystal, the apparatus comprising a laser system and a fluorescence detector configured to perform the method as described herein. The apparatus may further comprising an electronic controller coupled to the laser system and the fluorescence detector, the electronic controller configured to control the laser system according to a fluorescence signal detected by the fluorescence detector.

According to yet another aspect of the present invention there is provided a crystal comprising one or more colour centres fabricated according to the method as described herein. The presently described method enables the fabrication of a crystal comprising:

a crystal lattice; and
a plurality of colour centres disposed within the crystal lattice,
wherein the colour centres are configured to map onto a pattern of points having defined locations, within the crystal lattice, and wherein the colour centres have a maximum deviation from the defined locations of no more than 1 micrometre in a two-dimensional projection of the pattern of points.

The pattern can be any non-random distribution of points which may include points which are not regularly spaced as well as regularly spaced points. For example, the pattern could be a two dimensional or three dimensional array of regularly spaced colour centres. Alternatively, the pattern may be in the form of a shape in which the colour centres are not equally spaced. The pattern can include any distribution of points which is non-random and has a discernible symmetry or mathematical relationship between the points.

The maximum deviation of the colour centres in the two-dimensional projection of the pattern of points may be no more than one of: 750 nm; 500 nm; 300 nm; 200 nm; 150 nm; 100 nm; 80 nm; 50 nm; and 20 nm. Furthermore, the colour centres may have a maximum deviation from the defined locations in a depth direction orthogonal to the two-dimensional projection of no more than one of: 4 micrometres; 2 micrometres; 1 micrometre; 750 nm; 500 nm; 300 nm; 200 nm; 150 nm; or 100 nm. Differences in the accuracy of two-dimensional positioning and depth positioning can result from the shape of the focal region of the laser utilized to fabricate the colour centres. Improvements in the accuracy of depth positioning can be provided by utilising a larger range of angles of incidence for the processing beam(s) into the sample or by controlled implantation or use of a delta layer of impurity atoms.

As previously indicated, positional accuracy has been found to be improved when compared with methods which utilize bulk thermal annealing of the crystal to fabricate the colour centres. While not being bound by theory, it is believed that the laser diffusion method as described herein mobilises the vacancy defects in a smaller volume around the desired location for the colour centre when compared with bulk thermal annealing of the crystal. As such, positional accuracy is improved compared to prior art techniques. For example, positional accuracy has been found to be improved when compared to a prior art technique which uses a laser pulse to form localised vacancy defects in a region containing naturally occurring impurity atoms followed by a bulk annealing step to form an atom-vacancy defect.

According to certain configurations, only a single colour centre is disposed at least at 55%, 60%, 70%, 80%, 90%, or 100% of the points of the pattern within said maximum deviation. More broadly, a corresponding number (i.e. the same number) of colour centres (e.g. 1, 2, 3 . . . , n) are disposed at least at 55%, 60%, 70%, 80%, 90%, or 100% of the points of the pattern within said maximum deviation. That is, according to certain configurations, only a single colour centre is disposed at each and every one of the points within said maximum deviation. Alternatively, a controlled number (e.g. 2, 3, 4, 5, . . . , n) of colour centres can be formed at each and every one of the points within said maximum deviation. For example, it may be desired to have two or more closely spaced colour centres at each location to achieve dipolar coupling between their electronic spins.

The colour centres may each comprise at least one atom coupled to at least one vacancy or at least two vacancies coupled together. While the main embodiments of the present invention are concerned with forming vacancy containing colour centres utilizing laser induced diffusion of vacancy defects, it is envisaged that the laser processing will induce diffusion of other species such as interstitials, and at least in principle, other species such as hydrogen to form hydrogen related defects.

The colour centres may include one or more atoms selected from a range of options depending on the host crystal and desired application. Examples include nitrogen, silicon, germanium, tin, nickel, and lead. A primary focus of on-going work in certain quantum technologies is the nitrogen-vacancy colour centre. Furthermore, all the colour centres can be formed to be negatively charged. One advantage of the laser induced vacancy diffusion technique as described herein is that it allows, for example, 100% single $NV^-$ colour centres to be generated.

The methodology as described herein can be employed for a range of host crystals depending on the application. Examples of host crystals include diamond, silicon, silicon carbide, ZnO, and $SiO_2$. Nitrogen-vacancy colour centres in diamond are of particular interest.

To the extent that method involves the processing of a volume of material at the laser focus, it also provides a means for the modification of properties of a selected colour centre or group of colour centres via changes to the local environment. For example the proximity of vacancies or interstitial defects may create local strain that would affect colour centre properties such as spin coherence or optical transition energies. The laser processing may be used to facilitate diffusion of these defects away from the colour centre. Choice of laser pulse energy may offer a means to selectively diffuse defect species with lower activation energies for diffusion in preference to defect species with higher activation energies for diffusion.

Colour centre formation (and removal) using the method is a stochastic process and colour centres created may have a range of properties, such that in principle processing can be continued until a colour centre with the desired properties is formed. For example the orientation of a colour centre in the crystal lattice can be measured via the optical polarisation of the fluorescence signal, and so processing can be continued until a colour centre of the desired orientation is produced. In this way a collection of colour centres can be created that are preferentially oriented in one or more directions in the crystal lattice. While crystallographic orientation can be controlled to some extent during crystal growth, the location of such preferentially oriented as-grown colour centres cannot be accurately controlled.

The colour centres can be located at a depth below a surface of the crystal between 50 nm and 250 micrometres, more preferably between 3 micrometres and 60 micrometres. In many applications it is desirable to locate the colour centres close to a surface of the crystal. This is advantageous for optically addressing colour centres, out-coupling photons from colour centres, and providing optical out-coupling structures including photonic cavities coupled to the spin defects. However, surface defects can adversely affect the colour centre, e.g. to decrease its spin decoherence time. As such, the present methodology is useful as it enables the fabrication of colour centres which are relatively close to an external surface but sufficient removed from the surface to ensure that they are not unduly affected by surface and near-surface crystal damage. Furthermore, the present methodology enables the fabrication of such colour centres without introducing a large amount of damage into the crystal lattice structure.

The crystal may further comprise one or more photonic structures, such as an optical cavity, to which one or more of the colour centres are coupled, wherein the coupled colour centres are located no more than 100 nm from the one or more photonic structures or located within the one or more photonic structures. Alternatively or additionally, the crystal may comprises one or more surface projections with the colour centres disposed in the one or more surface projections.

Aberration correction of the processing laser beam can be used to enable the processing technique to be used under complex surface topographies. Surface structures may include configurations such as pillars, optical gratings, optical cavity structures, and solid immersion lenses.

BRIEF DESCRIPTION OF THE DRAWINGS

Embodiments of the present invention are described by way of example only with reference to the accompanying drawings in which.

DETAILED DESCRIPTION

Atomic defects in wide band gap materials show great promise for development of a new generation of quantum information technologies, but have been hampered by the inability to produce and engineer the defects in a controlled way. The present specification describes a methodology for the deterministic placement of colour centres in a crystal lattice using laser processing with fluorescence feedback. The technique is exemplified herein using the nitrogen-vacancy colour centre in diamond although can be applied to other host crystals and for fabricating a range of different colour centres.

As described in the background section, the nitrogen-vacancy (NV) colour centre in diamond is one of the foremost candidates for quantum information technologies, with single defects allowing optical addressing of electron spin and nuclear spin degrees of freedom with potential for applications in advanced sensing and computing. Here we demonstrate a method for the deterministic writing of individual NV centres at selected locations with high positioning accuracy using laser processing with online fluorescence feedback. This method provides a new tool for the fabrication of engineered materials and devices for quantum technologies. Furthermore, control of the position and number of NV centres has been improved as a result of two developments over previous work: (i) the use of laser-induced diffusion of vacancies in place of a thermal anneal to provide site-specific control of NV centre formation; and (ii) the use of online fluorescence measurement that provides feedback to allow active control of the process.

The method steps for fabricating colour centres in a crystal lattice according to one approach comprises the following steps:

S1—focusing a first laser beam into a crystal to generate vacancy defects in a focal region of the first laser beam within the crystal, the first laser beam having a first energy (optional);

S2—focusing a second laser beam onto the focal region to induce modification of the defects to form a colour centre (e.g. via diffusion of a vacancy defect within the focal region, by the laser-induced modification of an existing defect such as by the dissociation of a vacancy, or the generation of a Frenkel defect immediately adjacent to a substitutional impurity), the second laser beam optionally having a second energy which is lower than the first energy but which is sufficient to induce modification of defects within the focal region to form a colour centre;

S3—detecting, via fluorescence, when a colour centre is formed within the focal region; and S4—terminating the laser when a desired number of colour centres have been formed.

Figure 1:
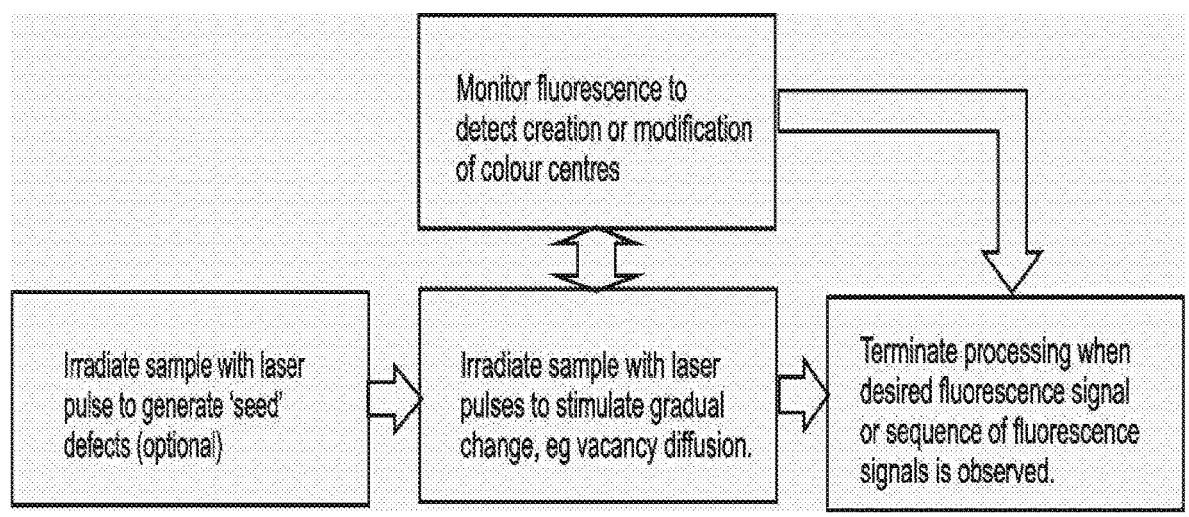
FIG. 1 shows a flow diagram of the method steps for fabricating and modifying colour centres in a crystal lattice.

FIG. 1 shows a flow diagram illustrating an example of the method steps for fabricating and modifying colour centres in a crystal lattice. A sample is irradiated with a laser pulse to generate "seed" defects. The sample is then irradiated with laser pulses to stimulate gradual change (e.g. via diffusion of a vacancy defect within the focal region, by the laser-induced modification of an existing defect such as by the dissociation of a vacancy, or the generation of a Frenkel defect immediately adjacent to a substitutional impurity). Fluorescence is monitored to detect creation or modification of colour centres. Finally, processing is terminated when a desired fluorescence signal or sequence of fluorescence signals is observed.

The laser treatment can be applied in two stages, e.g. a seeding laser pulse followed by a colour-centre-generating laser pulse train. However, it is also envisaged that the method can be utilized without the seeding pulse if, for example, vacancies are present already as a result of the crystal growth process, as a result of an alternate method for vacancy generation, e.g. electron beam irradiation, or by using laser pulses that provide for both vacancy generation and diffusion.

Figure 2:
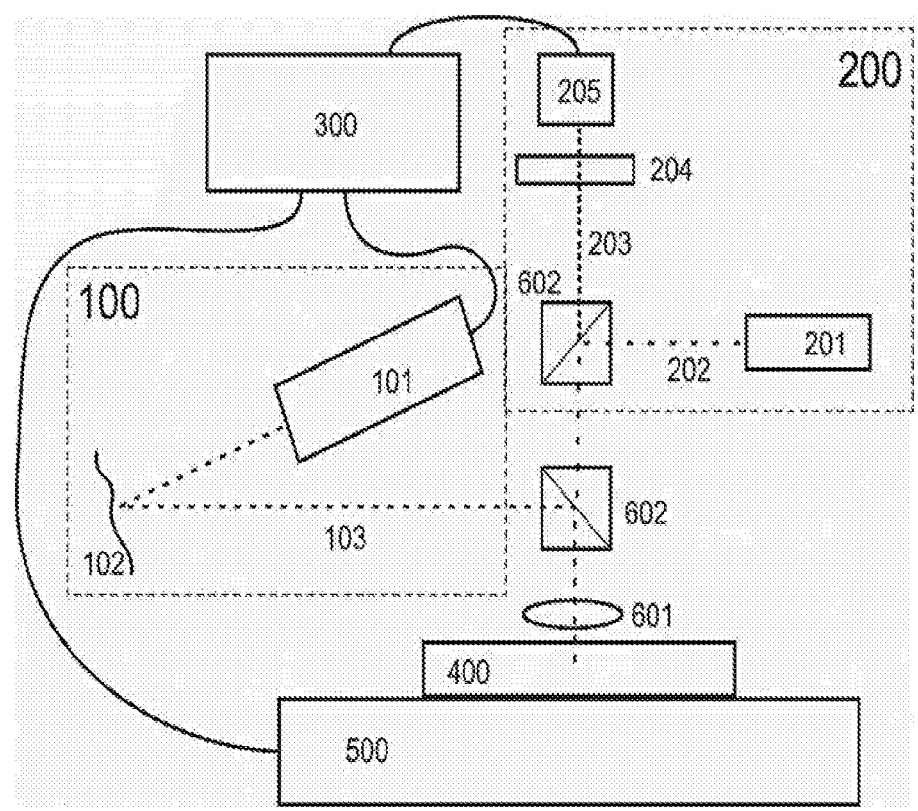
FIG. 2 shows a schematic diagram of an apparatus for implementing the method of FIG. 1.

An example of an optical layout for the combined laser processing and fluorescence feedback apparatus is shown in FIG. 2. The apparatus comprises a laser writing system 100 including a writing laser 101 and aberration correction optics 102 for generating a writing laser beam 103. Note that for certain configurations and applications the aberration correction optics may not be required. The apparatus further comprises a fluorescence detection system 200 including a fluorescence excitation laser 201 for generating a fluorescence excitation laser beam 202 resulting in a fluorescence beam 203. The fluorescence detection system 200 further comprises optical filters 204 and a fluorescence detector 205. The system further comprises optical beam splitters 602 and a focusing lens 601. The sample 400 for processing is provided on a sample positioning stage 500. An electronic control system 300 is coupled to the laser writing system 100, the fluorescence detection system 200, and to the sample positioning stage 500. The electronic control system 300 can be configured to control the laser system 100 according to a fluorescence signal detected by the fluorescence detector 200. However, it is also envisaged that the apparatus could be manually operated rather than automated in this fashion. A crystal sample 400 is provided on a sample stage 500. The laser system is configured to focus a laser beam into the crystal sample 400. The fluorescence detector is configured to detect fluorescence from a colour centre formed in the focal region of the laser beam within the crystal sample 400.

In this illustrative example, the laser processing was performed using a regeneratively amplified Ti:Sapphire laser (Spectra Physics Solstice) at a wavelength of 790 nm and a 1 kHz pulse repetition rate. The laser beam was expanded onto a liquid crystal phase-only spatial light modulator (SLM) (Hamamatsu X10468-02), which was imaged in a 4f configuration onto the back aperture of a 60×1.4NA Olympus PlanApo oil immersion objective. A diamond sample was mounted on precision translation stages (Aerotech x-y: A131_10100; z: ANT95-3-V) providing three dimensional control. Prior to the objective, the laser pulse was linearly polarised and had a duration which was measured to be 250 fs using an intensity autocorrelator (APE Pulsecheck). The pulse duration at focus is slightly increased due to dispersion in the objective lens. To optimise the aberration correction, the phase pattern displayed on the SLM was adjusted to minimise the pulse energy needed to produce visible fluorescence at test processing positions of similar depth in the sample.

Fluorescence feedback was achieved using a scanning confocal microscope, with excitation from a frequency-doubled diode-pumped YAG laser at 532 nm and detection using a silicon single photon avalanche diode (Excelitas). Excitation power of 2 mW was reflected towards the sample at a 570 nm dichroic beamsplitter, and fluorescence transmitted through the dichroic was additionally filtered using a 650-750 nm band pass filter.

Effective correction for aberrations of the processing laser beam allows the point spread function near the focus to be approximated to that of a focused Gaussian beam $$I(r,z) = I_0 \cdot \frac{1}{1+\left(\frac{z}{z_R}\right)^2} \cdot e^{-\frac{2r^2}{w_z^2}}$$

where $$w_z = w_0 \sqrt{1+\left(\frac{z}{z_R}\right)^2}$$

is the beam width at axial displacement z, $w_0$ is the beam waist and $z_R$ is the Rayleigh range. The laser processing volume is determined from the point spread function of the processing laser and the nonlinearity of the process involved. For a process that is activated according to the $y^{th}$ power of the laser intensity, the point spread function is modified to $$I_y(r,z) = I_0^y \cdot \frac{1}{\left(1+\left(\frac{z}{z_R}\right)^2\right)^y} \cdot e^{-\frac{2yr^2}{w_z^2}}$$

such that the waist for the nonlinear process is equal to the linear beam waist multiplied by a factor $$\frac{1}{\sqrt{y}}$$

and the axial dimension for the nonlinear process is equal to the Rayleigh range multiplied by a factor $\sqrt{2^{1/y}-1}$.

The present manifestation is achieved with a numerical aperture of 1.4 achieved with an oil immersion objective lens, and with a processing laser wavelength of 790 nm, such that we estimate that $w_0$=297 nm and $z_R$=852 nm. The dimensions of the processing region will then depend on the degree of nonlinearity, y. The values of this parameter for different processes are not well known, so we provide here only some illustrative examples which appear consistent with our measured data. For a process with a nonlinearity y=9, the waist will be reduced reduced to 99 nm, and the axial dimension is reduced to 241 nm. In another example of a process with nonlinearity y=14, the waist will be reduced to 79 nm and the axial dimension is reduced to 192 nm.

Higher numerical apertures than that of the present manifestation can be achieved using solid immersion lenses that will in principle lead to further reductions in the processing volume beyond those described above. For example the use of a diamond solid immersion lens might readily achieve a numerical aperture of 2.1 that would reduce the dimensions of the linear point spread function to $w_0$=198 nm and $z_R$=374 nm. For a y=14 nonlinear process the radial and axial dimensions would then be 53 nm and 84 nm respectively.

Photoluminescence (PL) imaging to characterise the written colour centres subsequent to laser processing was carried out using a scanning confocal microscope and spectroscopy with a 500 mm spectrograph (Acton SpectraPro 500i) fitted with a back-illuminated CCD camera (Princeton Spec-10 100B), with >90% quantum efficiency across the wavelength range of interest. Excitation was performed using a frequency-double YAG laser (λ=532 nm) with a maximum power delivery to the sample of 4 mW. A laser clean-up filter is used in excitation, combined with a 540 nm dichroic beam splitter and a 532 nm blocking notch filter in the collection optics. When recording a PL image, a 650 nm long-pass filter is inserted in the fluorescence collection path to block the diamond Raman emissions (all filters were from Semrock).

Figure 3:
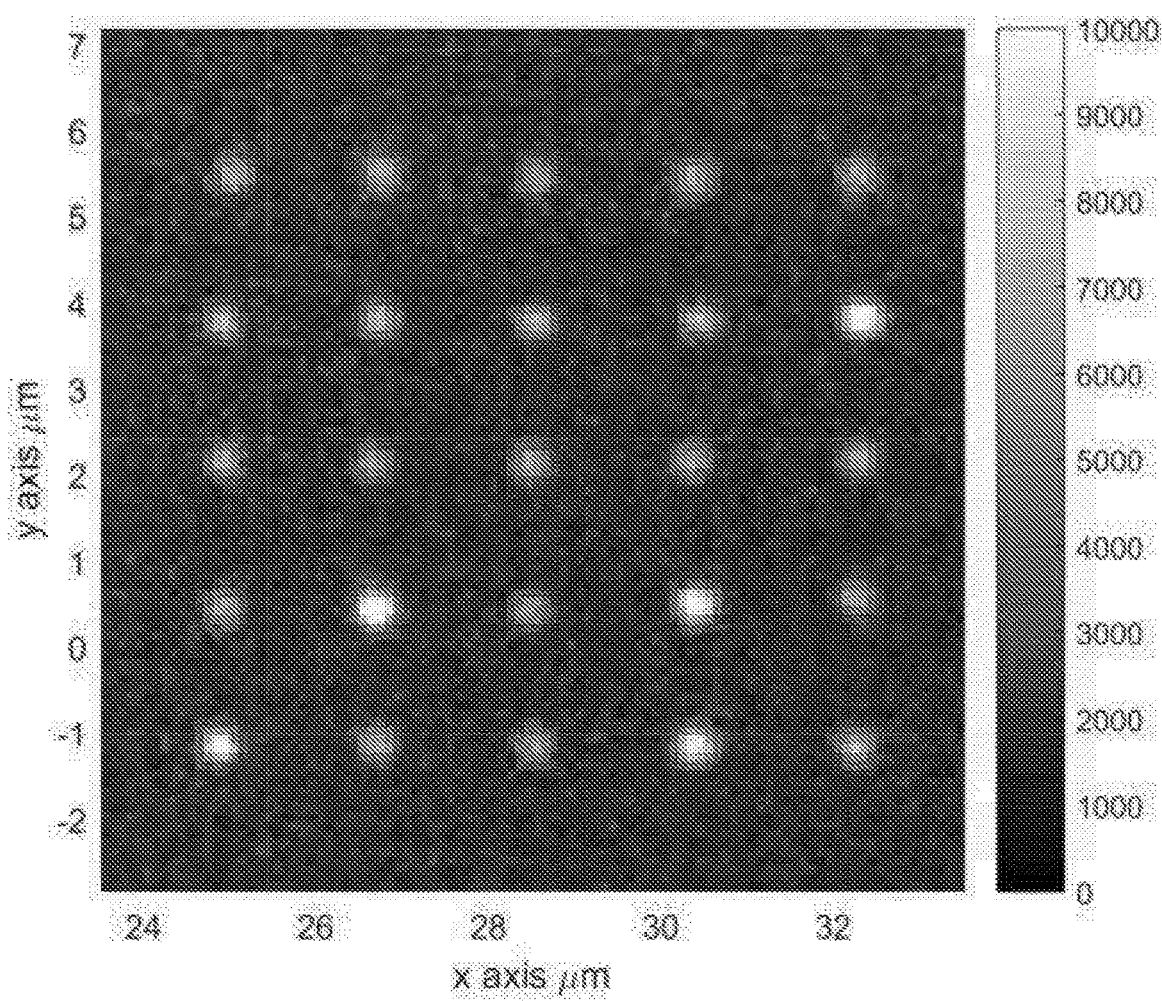
FIG. 3 shows a fluorescence image of a 5×5 array consisting entirely of single NV⁻ colour centres written in a two-dimensional square grid with a spacing of 2 micrometres in a diamond crystal.

FIG. 3 shows a fluorescence image of an array of 25 sites written in a single crystal diamond sample. At each site in the array, an initial laser pulse of energy 23 nJ was used to generate vacancies, followed by a 1 kHz stream of pulses of energy 15 nJ to induce vacancy diffusion. Fluorescence within the wavelength range 650 nm to 750 nm was monitored until a signal indicating the creation of a negatively charged NV centre was recorded, at which point the processing was halted.

Figure 4:
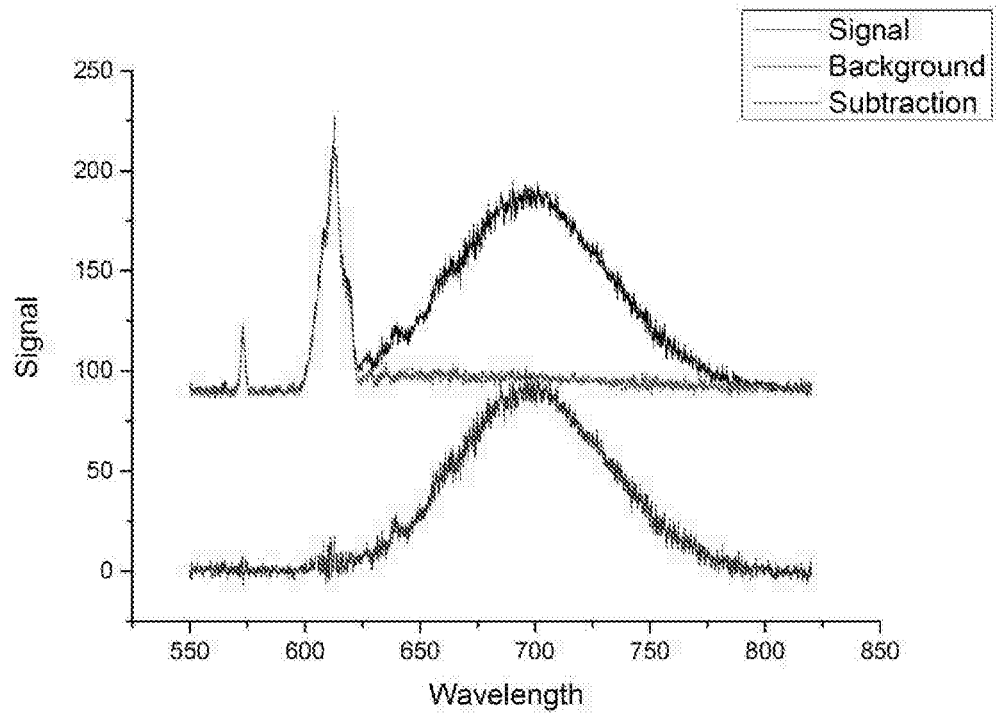
FIG. 4 shows exemplar fluorescence spectra measured from a site in FIG. 3—the upper traces show raw data measured from the processed site (signal) and adjacent to the processed site (Background)—the lower trace (Subtraction) shows the difference between the signal and background, such that the Raman signals at 573 nm and 610 nm are removed and a clean NV-fluorescence spectrum is revealed.
Figure 5:
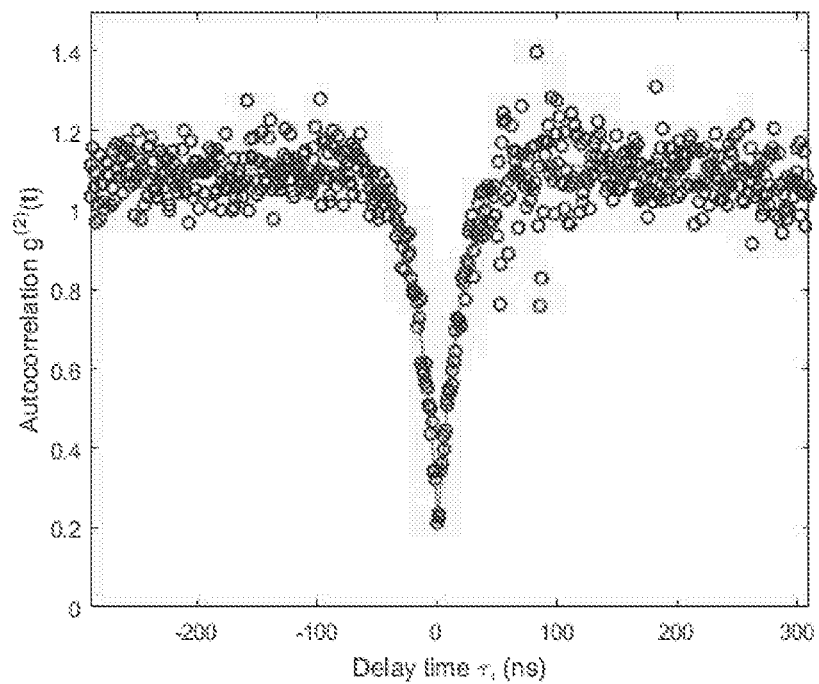
FIG. 5 shows an exemplar histogram of the photon autocorrelation function $g^{(2)}(t)$ which shows a characteristic dip near to t=0 indicative of quantum light emission from a single atom-like defect.

Measurements of photon statistics and fluorescence spectra from the processed sites revealed that all 25 of the sites are single NV$^-$ colour centres. The NV centres are stable in the negatively charged state with no evidence of fluorescence from the charge-neutral state NV$^0$ and no discernible fluorescence from other defects such as the isolated vacancy (GR1) or extended defects (B band), as evidenced by the exemplar fluorescence spectrum displayed in FIG. 4. That the fluorescence from each site originates from a single NV— centre is evidenced by measuring the photon time-autocorrelation function $g^{(2)}(t)$ using the Hanbury Brown and Twiss method. A typical histogram is shown in FIG. 5, displaying $g^{(2)}(0)=0.2$.

Figure 6:
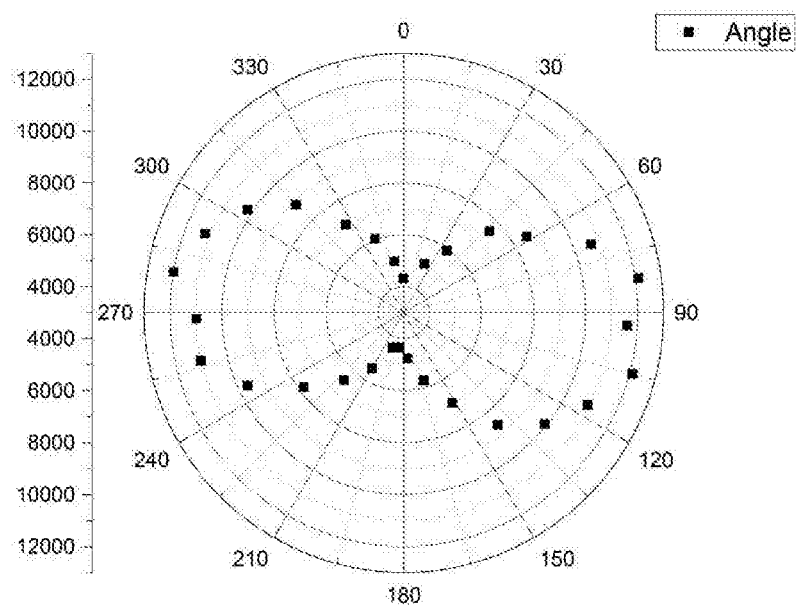
FIG. 6 shows polar plots of the fluorescence intensity as a function of linear polarisation for two of the single NV centres from FIG. 3.
Figure 6:
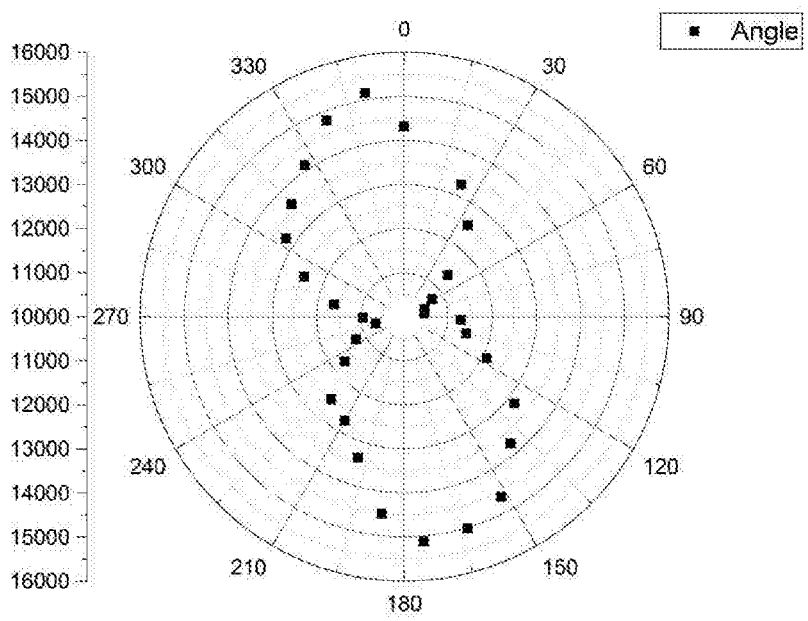

The orientation of the NV$^-$ centres created can be determined using the intensity and optical polarization of the fluorescence measurement, since the transition dipoles of the defect lie in the plane perpendicular to the physical axis of threefold rotational symmetry. In the sample used, the crystal plane parallel to the surface is (110) such that NVs whose axes of symmetry are oriented along the [1$\bar{1}$1] and [$\bar{1}$11] crystal axes lie in the plane and their fluorescence displays a high degree of linear polarisation. NVs oriented along [111] and [11$\bar{1}$], by contrast, make angles of 55° with the image plane, so that their measured fluorescence is more intense but only weakly polarised. Two example polar plots showing fluorescence intensity as a function of the angle of a linear polariser placed in the fluorescence detection path of the microscope are shown in FIG. 6. The upper plot shows an NV centre with its axis of symmetry lying in the plane and pointing at a relative angle of 7°, while the lower plot shows an NV centre with its axis of symmetry at an angle of 55° to the image plane and pointing at a relative angle of 76°. These plots reveal how the orientation of an NV colour centre in the lattice can be determined from the polarisation of the fluorescence compatible with online monitoring.

The positions of the NVs in the image plane relative to the targeted array points were measured with an accuracy of 20 nm by establishing the centroids of the points in the fluorescence image.

Figure 7:
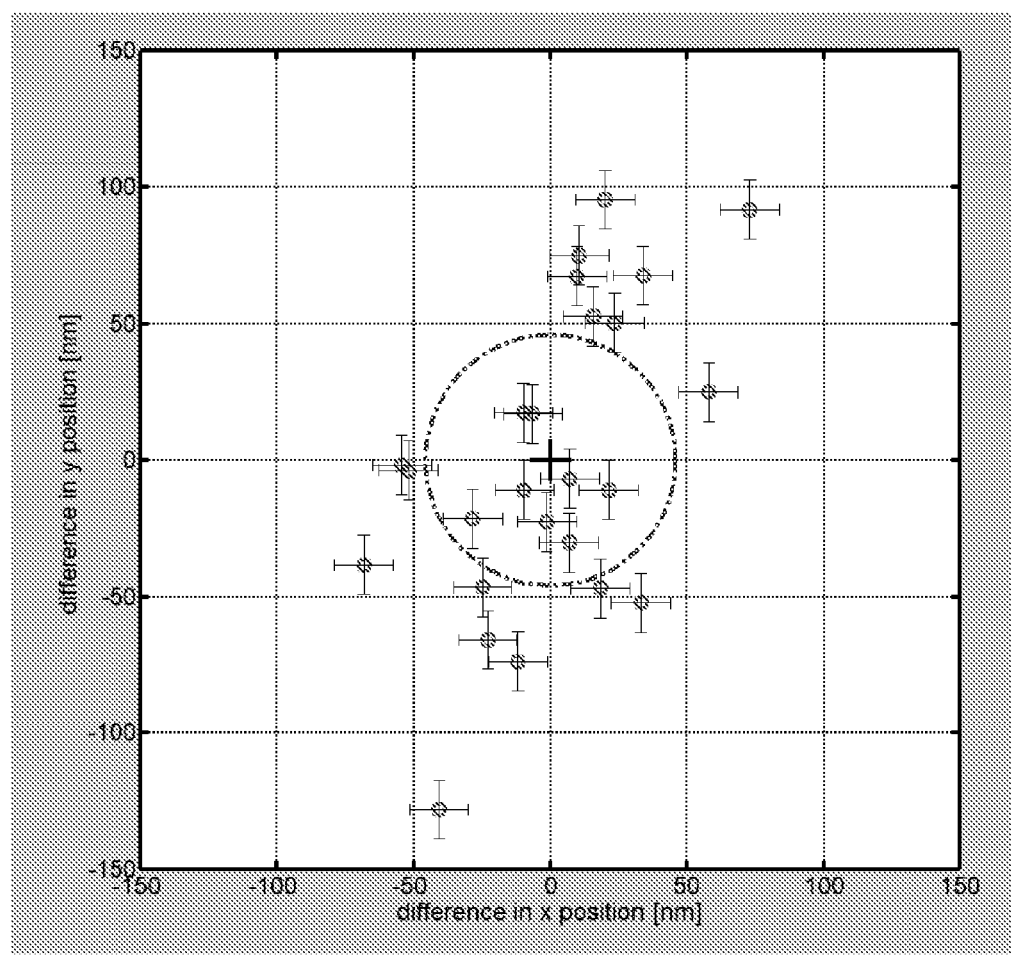
FIG. 7 shows a scatter plot of the measured positions in the image plane (perpendicular to the optical axis of the processing laser beam when focused into the crystal) of the 25 single NV— centres in FIG. 3 relative to the targeted positions—error bars on the individual points represent 95% confidence in the position measurements—the dashed circle represents the $e^{-1/2}$ bound of the maximum likelihood 2D Gaussian distribution for the dataset.

The measured distribution is shown in FIG. 7. A maximum likelihood analysis of the distribution using the 2D Gaussian probability distribution $$P(r) = I_0 \cdot e^{-\frac{r^2}{2\sigma^2}}$$

reveals a distribution width of 2σ=90 nm, indicated in the figure by the dashed circle. This measured scatter in position relative to the targeted point is a factor of 3.3 smaller than the estimated focal width $w_0$, consistent with a nonlinearity of the field intensity raised to the 11$^{th}$ power.

Figure 8:
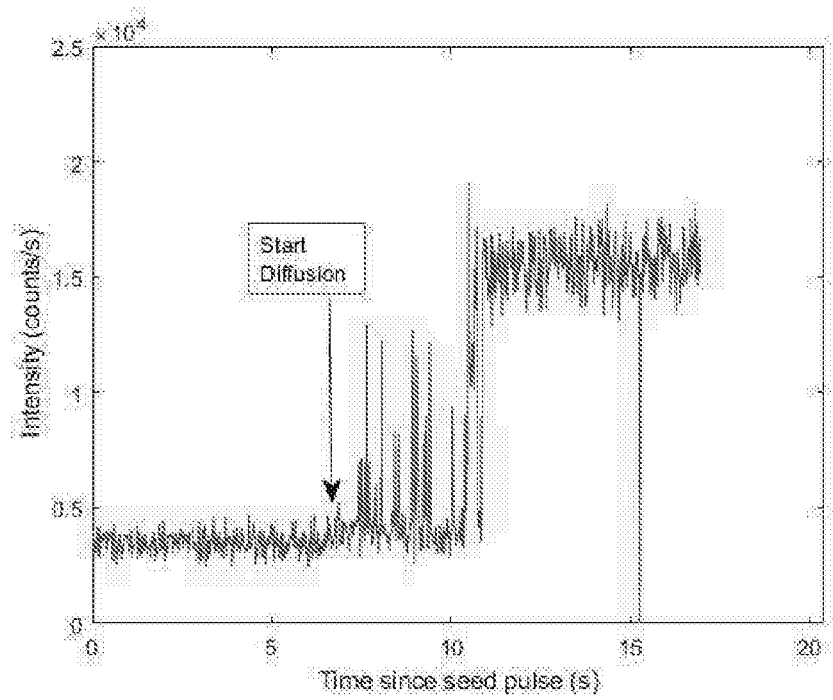
FIG. 8 shows a fluorescence intensity trace as a function of time in which the laser processing was halted upon first observation of a strong and stable fluorescence signal indicative of a single NV⁻ colour centre.
Figure 9:
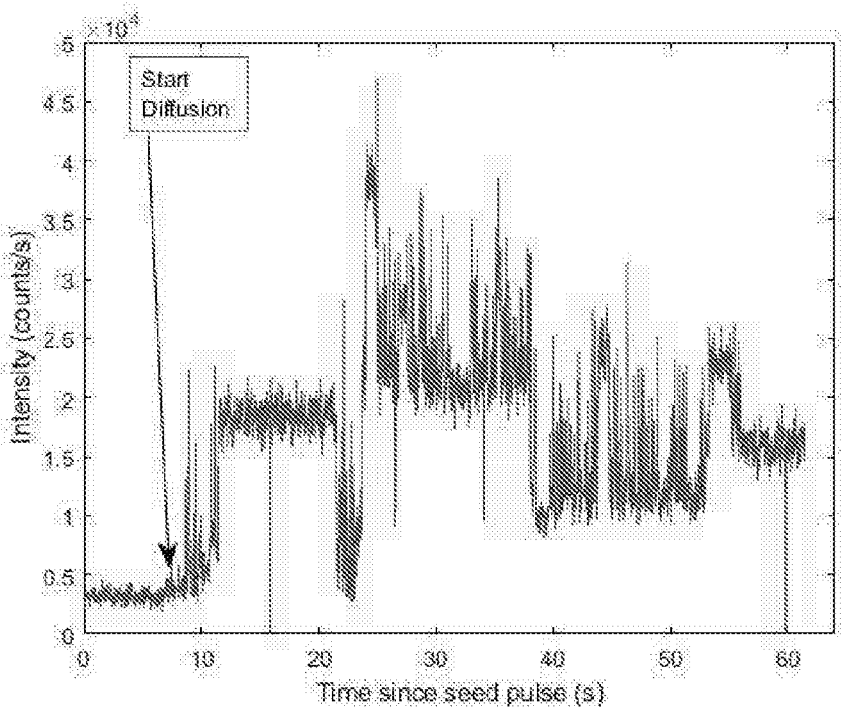
FIG. 9 shows a fluorescence intensity trace as a function of time showing multiple events attributable to the creation and removal of NV⁻ defects during extended laser processing.

Two examples of traces from the fluorescence intensity monitor are shown in FIGS. 8 and 9 to provide insight into the dynamics of the laser processing. The zero of the horizontal time axis corresponds to the seed laser pulse and this is followed by commencement of a laser pulse stream (labelled with an arrow). The vertical axis shows the number of photon detection events per second recorded on the detector, at a sampling rate of 50 Hz. The creation of an NV centre is first indicated by intermittent fluorescence of an intensity of several thousand photon counts per second at the detector, and then after a few seconds by stable, high intensity fluorescence. The processing is terminated shortly after stable fluorescence is observed.

Continued processing of a site beyond the creation of a single NV centre reveals the occurrence of further events within the focal volume. FIG. 9 shows an example of a fluorescence trace in which the first stable fluorescence disappears after about 10 seconds of continued processing, followed by several other changes of measured fluorescence intensity between levels of short term stability over the following 40 second period. Measurements of processed sites terminated at different stages suggest that individual NV centres can be both created and destroyed, and that different numbers of NVs can be produced at a site with a degree of control.

While not being bound by theory, the physical mechanism behind the laser processing method is briefly discussed below.

The generation of vacancies in diamond by a sub-picosecond laser pulse is thought to be via multi-photon absorption that promotes electrons to high energy states, followed by rapid relaxation of the electrons by transfer of their energy to the lattice. It follows that the laser-induced vacancy diffusion processes observed here may occur by a similar process, but with a lower nonlinearity resulting from the lower energy requirement for a vacancy to hop to an adjacent lattice site than for a new vacancy to be created. Diffusion of other species with low activation energies, such as self-interstitials, is also likely. These experiments provide qualitative support for this picture with a high degree of nonlinearity observed in the rate of NV$^-$ generation with the energy of the diffusion pulses, such that only a narrow window of pulse energies exists in which NV$^-$ centres are generated but continued processing does not ultimately lead to runaway lattice damage indicative of further vacancy generation. Recently Kononenko et al. have reported the laser-induced generation of near-surface NV centres in a nano-ablation regime, and concluded that the diffusion process is driven by the photoinduced plasma. It is believe that this mechanism can be ruled out for the present process in bulk diamond (sub-surface), since no plasma fluorescence is detected by the fluorescence monitoring during processing.

We hypothesize that the intermittent fluorescence observed before stable NV creation is related to the unstable binding of the NV complex in the presence of a nearby self-interstitial. The seed pulse generates Frenkel defects comprising a vacancy and nearby interstitial which experience a mutual attraction due to the opposite strain fields that surround them in the diamond lattice. It is known that the interstitial is surrounded by a positive (compressive) strain field while the vacancy is surrounded by a negative (tensile) strain field, and that substitutional nitrogen in the lattice is also surrounded by a positive strain field. It is also known that the substitutional nitrogen will therefore attract the vacancy and repel the interstitial. We hypothesize that after a Frenkel defect has been created close to a substitutional nitrogen, subsequent laser-induced diffusion of the vacancy and interstitial may therefore result in the vacancy diffusing towards the nitrogen defect and binding to it to form an NV centre. This NV centre creation event may occur while the interstitial remains sufficiently close that its attractive force on the vacancy counteracts the NV binding energy such that the vacancy can easily be dissociated from the substitutional nitrogen under subsequent laser pulses. The NV centre remains unstable while the interstitial is nearby but after continued processing the interstitial diffuses far enough away that the vacancy binds stably to the nitrogen.

The above is one hypothesis for the mechanism by which stable NV centres are created using the claimed method. Other physical mechanisms may exist that lead to the generation and removal of colour centres from the lattice and which may in principle be made use of within the purpose of this invention. For example an existing compound defect such as $NV_2$ (a bound complex containing a nitrogen atom and two vacancies) could dissociate to form an NV colour centre and a vacancy through the action of a laser pulse. Alternatively a laser pulse could generate a vacancy directly in a site adjacent to an existing defect to form a colour centre (for example next to a substitutional nitrogen atom to form an NV centre). Equally a number of laser-induced mechanisms may exist that could remove a colour centre from the lattice. For example a vacancy may be dissociated from a colour centres (e.g. an NV centre dissociated to form a substitutional nitrogen and a lone vacancy), or a vacancy undergoing laser-induced diffusion may bind to a colour centre or a vacancy may be directly generated at an adjacent lattice site to make a larger complex (for example a NV centre to form an $NV_2$ complex). Alternatively a different mobile defect could bind to a colour centre to create a different defect (for example a carbon interstitial binding to an NV centre would annihilate the vacancy to leave a substitutional nitrogen atom).

There are several ways in which the work reported here can be extended. The diamond sample used in this study contains a nitrogen concentration of ~10 ppm, which facilitates $NV^-$ centre generation using ~$10^4$ diffusion pulses. Lower nitrogen concentration material typically needed for spin coherence times exceeding 100 μs will require a commensurately greater number of diffusion pulses to be applied. Combination of laser processing with samples containing implanted or delta-doped nitrogen might be used to further improve positioning accuracy, particularly with respect to depth, whilst retaining the key characteristics of the method.

In summary, the present specification describes a method for localised laser processing of wide band gap materials and demonstrates the deterministic creation of single NV centres at desired locations in diamond. Feedback provided by online spectroscopic study of the processed region provides information on defect formation, orientation, and aspects of the local environment, and can be extended to measure other properties of colour centres which can probe further features of the local environment and provide additional routes to optimisation. The processing method can in principle be applied to the controlled writing of other colour centres in diamond, or fluorescent defects in other materials such as the divacancy in silicon carbide. It provides a tool with potential for wide application in the engineering of materials at the quantum level. Accordingly, it will be appreciated that while the invention has been described in relation to $NV^-$ colour centres in diamond, it will be appreciated that various alternative embodiments can be provided without departing from the scope of the invention which is defined by the appending claims.

The invention claimed is:

1. A crystal comprising:
    a crystal lattice; and
    a plurality of colour centres disposed within the crystal lattice,
    wherein the colour centres are configured to map onto a pattern of points having defined locations, within the crystal lattice, and
    wherein the colour centres have a maximum deviation from the defined locations of no more than 1 micrometre in a two-dimensional projection of the pattern of points,
    and wherein a corresponding number of colour centres are disposed at least at 55% of the points of the pattern within the maximum deviation.

2. The crystal according to claim 1,
    wherein the maximum deviation of the colour centres in the two-dimensional projection of the pattern of points is no more than one of: 750 nm; 500 nm; 300 nm; 200 nm; 150 nm; 100 nm; 80 nm; 50 nm; and 20 nm.

3. The crystal according to claim 1,
    wherein the colour centres have a maximum deviation from the defined locations in a depth direction orthogonal to the two-dimensional projection of no more than one of: 4 micrometres; 2 micrometres; 1 micrometre; 750 nm; 500 nm; 300 nm; 200 nm; 150 nm; 100 nm; or 50 nm.

4. The crystal according to claim 1,
    wherein the corresponding number of colour centres being disposed at least at 55% of the points of the pattern within the maximum deviation comprises only a single colour centre being disposed at least at one of: 55%, 60%, 70%, 80%, 90%, or 100% of the points of the pattern within the maximum deviation.

5. The crystal according to claim 1,
    wherein the corresponding number of colour centres being disposed at least at 55% of the points of the pattern within the maximum deviation comprises the corresponding number of colour centres being disposed at least at one of: 55%, 60%, 70%, 80%, 90%, or 100% of the points of the pattern within the maximum deviation.

6. The crystal according to claim 1,
    wherein the colour centres each comprise at least one atom coupled to at least one vacancy or at least two vacancies coupled together.

7. The crystal according to claim 1,
    wherein the pattern forms a two dimensional or three dimensional array of regularly spaced colour centres or another non-random distribution of colour centres with a symmetric or mathematical relationship between the distribution of colour centres.

8. The crystal according to claim 1,
    wherein the colour centres are preferentially oriented in one or more crystallographic directions of the crystal lattice.

9. The crystal according to claim 1,
    further comprising one or more photonic structures to which one or more of the colour centres are coupled, wherein the coupled colour centres are located no more than 100 nm from the one or more photonic structures or located within the one or more photonic structures.

10. The crystal according to claim 1,
    wherein the crystal comprises one or more surface projections and the colour centres are disposed in the one or more surface projections.

11. A method of fabricating one or more colour centres in a crystal, the method comprising:
    focusing a first laser beam into a crystal to generate vacancy defects within a focal region of the first laser beam within the crystal lattice, the first laser beam having a first energy;

focusing a second laser beam onto the focal region to induce diffusion of the vacancy defects within the focal region, the second laser beam having a second energy which is lower than the first energy, wherein the second laser beam provides a stream of laser pulses of energy sufficiently high to induce vacancy diffusion within the focal region, but sufficiently low as to not form new vacancy defects;

detecting, via fluorescence, when a colour centre is formed within the focal region; and terminating the laser when a desired number of colour centres have been formed.

12. The method according to claim 11, wherein the laser is controlled to form an atom-vacancy defect by one of:
   diffusion of a vacancy defect within the focal region;
   laser-induced modification of an existing defect by dissociation of a vacancy; or generation of a Frenkel defect immediately adjacent to a substitutional impurity.

13. The method according to claim 11, wherein the second laser beam provides sub-picosecond laser pulses.

14. The method according to claim 11, wherein the laser beam has a cross-sectional beam profile with a full-width-half maximum of no more than at least one of: 500 nm, 400 nm, 350 nm, 200 nm, 250 nm, or 100 nm.

15. The method according to claim 11, further comprising:
   after detecting, via fluorescence, when a colour centre, or combination of colour centres, is formed within the focal region, making a determination from the fluorescence that the colour centre or combination of colour centres does not have a desired property or combination of properties; and
   in response to making the determination, continuing laser processing until the colour centre or combination or colour centres is formed with the desired property or combination of properties.

16. The method according to claim 15, further comprising:
   prior to continuing laser processing until the colour centre or combination or colour centres is formed with the desired property or combination of properties, controlling laser processing to dissociate the colour centre or combination of colour centres.

17. An apparatus for fabricating colour centres in a crystal, the apparatus comprising:
   a laser system comprising a laser;
   a fluorescence detector; and
   an electronic controller coupled to the laser system and the fluorescence detector, wherein the controller is configured to:
   focus a first laser beam into a crystal to generate vacancy defects within a focal region of the first laser beam within the crystal lattice, the first laser beam having a first energy;
   focus a second laser beam onto the focal region to induce diffusion of the vacancy defects within the focal region, the second laser beam having a second energy which is lower than the first energy, wherein the second laser beam provides a stream of laser pulses of energy sufficiently high to induce vacancy diffusion within the focal region, but sufficiently low as to not form new vacancy defects;
   use the fluorescence detector to detect, via fluorescence, when a colour centre is formed within the focal region; and
   terminate the laser when a desired number of colour centres have been formed.

18. A crystal comprising one or more colour centres fabricated by operations comprising:
   focusing a first laser beam into a crystal to generate vacancy defects within a focal region of the first laser beam within the crystal lattice, the first laser beam having a first energy;
   focusing a second laser beam onto the focal region to induce diffusion of the vacancy defects within the focal region, the second laser beam having a second energy which is lower than the first energy, wherein the second laser beam provides a stream of laser pulses of energy sufficiently high to induce vacancy diffusion within the focal region, but sufficiently low as to not form new vacancy defects;
   detecting, via fluorescence, when a colour centre is formed within the focal region; and
   terminating the laser when a desired number of colour centres have been formed.

19. A crystal according to claim 18, the crystal comprising:
   a crystal lattice; and
   a plurality of colour centres disposed within the crystal lattice,
   wherein the colour centres are configured to map onto a pattern of points having defined locations, within the crystal lattice, and
   wherein the colour centres have a maximum deviation from the defined locations of no more than 1 micrometre in a two-dimensional projection of the pattern of points,
   wherein a corresponding number of colour centres are disposed at least at 55% of the points of the pattern within the maximum deviation.

* * * * *